(12) United States Patent
Yarlagadda et al.

(10) Patent No.: US 9,382,642 B2
(45) Date of Patent: Jul. 5, 2016

(54) REACTION CHAMBER OF AN EPITAXIAL REACTOR AND REACTOR THAT USES SAID CHAMBER

(75) Inventors: Srinivas Yarlagadda, Baranzate (IT); Natale Speciale, Paderno Dugnano (IT); Franco Preti, Milan (IT); Mario Preti, Legnano (IT)

(73) Assignee: LPE S.P.A., Baranzate (IT)

( * ) Notice: Subject to any disclaimer, the term of this patent is extended or adjusted under 35 U.S.C. 154(b) by 1170 days.

(21) Appl. No.: 13/259,818

(22) PCT Filed: Apr. 16, 2010

(86) PCT No.: PCT/IB2010/051666
§ 371 (c)(1),
(2), (4) Date: Sep. 23, 2011

(87) PCT Pub. No.: WO2010/119430
PCT Pub. Date: Oct. 21, 2010

(65) Prior Publication Data
US 2012/0027646 A1   Feb. 2, 2012

(30) Foreign Application Priority Data

Apr. 17, 2009   (IT) .............. MI2009A0629

(51) Int. Cl.
| | | |
|---|---|---|
| C30B 35/00 | (2006.01) |
| C30B 25/08 | (2006.01) |
| C23C 16/46 | (2006.01) |
| C30B 25/10 | (2006.01) |
| C30B 29/06 | (2006.01) |
| C30B 29/08 | (2006.01) |
| C30B 29/36 | (2006.01) |
| C30B 29/40 | (2006.01) |

(52) U.S. Cl.
CPC ............. *C30B 25/08* (2013.01); *C23C 16/46* (2013.01); *C30B 25/10* (2013.01); *C30B 29/06* (2013.01); *C30B 29/08* (2013.01); *C30B 29/36* (2013.01); *C30B 29/403* (2013.01); *C30B 29/406* (2013.01); *C30B 35/00* (2013.01)

(58) Field of Classification Search
USPC .................. 117/90, 95, 200, 900
See application file for complete search history.

(56) References Cited

U.S. PATENT DOCUMENTS

| | | | |
|---|---|---|---|
| 4,991,540 A | 2/1991 | Jurgensen | |
| 5,221,356 A * | 6/1993 | Hillier et al. | 118/730 |
| 5,256,060 A * | 10/1993 | Philipossian et al. | 432/152 |
| 5,441,570 A * | 8/1995 | Hwang | 118/725 |
| 6,331,212 B1 | 12/2001 | Mezey, Sr. | |
| 7,285,228 B2 * | 10/2007 | Laermer et al. | 216/67 |
| 8,497,587 B2 * | 7/2013 | Ma | 257/796 |

FOREIGN PATENT DOCUMENTS

| | | |
|---|---|---|
| CN | 1430789 | 7/2003 |
| EP | 0147967 | 7/1985 |

(Continued)

*Primary Examiner* — Robert M Kunemund
(74) *Attorney, Agent, or Firm* — Brannen Law Office, LLC

(57) ABSTRACT

The present invention relates to a reaction chamber of an epitaxial reactor that essentially consists of a quartz piece; the quartz piece comprises a quartz piece portion (1) having an internal cavity (2) defined by walls (1A, 1B, 1C, 1D); the cavity (2) comprises a reaction and deposition zone (3) of the epitaxial reactor; the zone (3) is adapted to house a susceptor (4) to be heated therein; the reaction chamber also comprises a quartz component (5) arranged close to said walls (1A, 1B, 1C, 1D) in such a manner as to form a counterwall and to be a wall of said zone (3).

16 Claims, 3 Drawing Sheets

(56) References Cited

FOREIGN PATENT DOCUMENTS

| | | |
|---|---|---|
| JP | 4-186825 | 7/1992 |
| WO | 96/10659 | 4/1996 |
| WO | 97/06288 | 2/1997 |

* cited by examiner

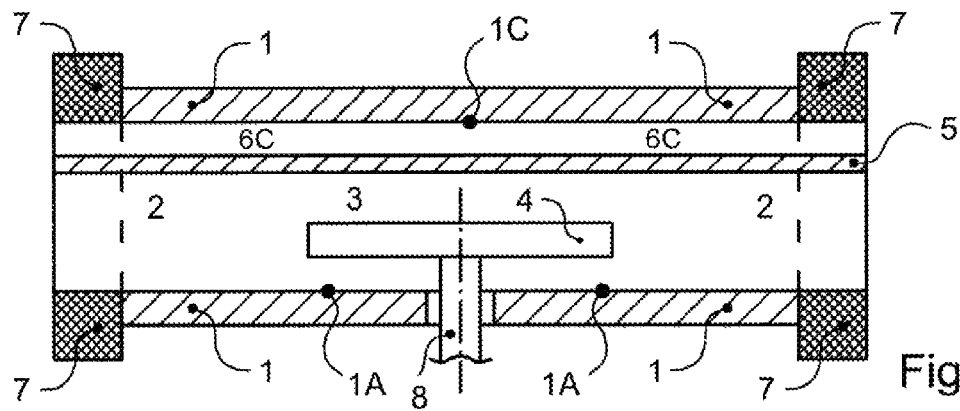
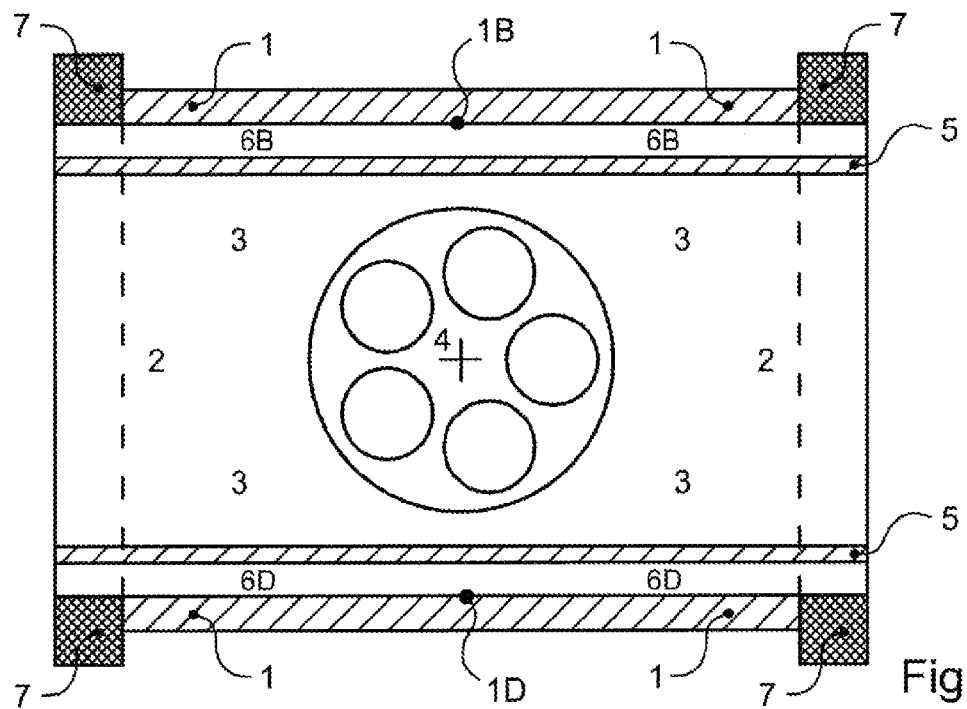
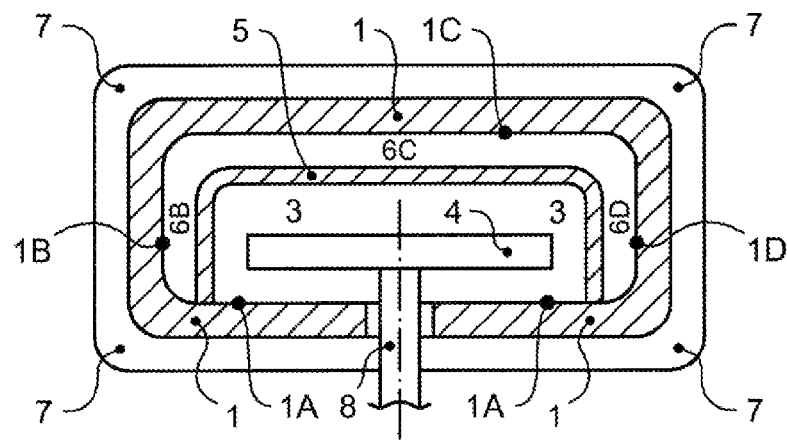
Fig.2A
Fig.2B
Fig.2C

REACTION CHAMBER OF AN EPITAXIAL REACTOR AND REACTOR THAT USES SAID CHAMBER

This application is being filed in the United States for the national phase of international application number PCT/IB2010/051666 filed on 16 Apr. 2010 (publication number WO 2010/119430 A1), claiming priority on prior application MI2009A000629 filed in Italy on 17 Apr. 2009, the contents of each being hereby incorporated herein by reference.

FIELD OF THE INVENTION

The present invention relates to a reaction chamber of an epitaxial reactor and to a reactor that uses said chamber.

BACKGROUND ART

Epitaxial reactors are machines used to deposit smooth and uniform monocrystalline or polycrystalline layers of materials on substrates; the substrates thus treated are used to produce electric devices (such as solar cells), electronic devices (such as MOSFETs and LEDs) and microelectronic devices (such as integrated circuits). Therefore, the quality of the layer deposited, in terms of defectiveness, uniform thickness and uniform resistivity, is extremely important and subject to increasingly strict requirements.

Substrates are very thin disks (typically in the interval from 100 µm to 1,500 µm) and with greatly variable diameter (typically in the interval from 1"=25 mm to 18"=450 mm), and can be made, for example, of silicon [SI], silicon carbide [SiC], germanium [Ge], gallium arsenide [GaAs], aluminium oxide or "sapphire" [$Al_2O_3$], gallium nitride[GaN].

The materials deposited are typically conductor and semiconductor materials, such as silicon [Si], silicon carbide [SiC], germanium [Ge], gallium arsenide [GaAs], aluminium nitride [AlN], gallium nitride [GaN].

The layer deposited and the substrate below can be made of the same material or of different materials.

The thickness of the layer deposited can be in a wide interval from a few nanometres to several millimetres; when the thickness of the layer deposited is greater than 1 mm, the deposition process is generally called "bulk growth".

Known epitaxial reactors comprise a reaction chamber consisting in general essentially of a quartz piece; the quartz piece comprises a quartz piece portion having the shape of a cylinder, prism, cone, pyramid or parallelepiped and provided with at least one internal cavity defined by walls; this cavity comprises a reaction and deposition zone of the epitaxial reactor; this zone is adapted to house at least one susceptor to be heated therein; the susceptor serves to support and often also to heat the substrates.

There are reactors of many types; depending on the type, the chamber can be arranged vertically or horizontally (rarely obliquely); depending on the type, the susceptor can have the shape of a disk, prism, cylinder, pyramid, cone and can be solid or hollow; depending on the type, the susceptor can be heated by means of resistors, inductors, lamps (rarely internal burners); depending on the type, the reactors can be "cold wall" or "hot wall) (these terms refer to the walls defining the space inside which the reaction and deposition takes place).

The processes of epitaxial reactors are performed at high temperatures, i.e. from several hundreds of degrees Celsius to a few thousands of degrees Celsius (for example, deposition of polycrystalline silicon is performed at temperatures typically between 450° C. and 800° C., deposition of monocrystalline silicon on silicon substrates is performed at temperatures typically between 850° C. and 1,250° C., deposition of monocrystalline silicon carbide on silicon substrates is performed at temperatures typically between 1,200° C. and 1,400° C., deposition of monocrystalline silicon carbide on silicon carbide substrates is performed at temperatures typically between 1,500° C. and 1,700° C. for "epitaxial growth" and at temperatures typically between 1,900° C. and 2,400° C. for "bulk growth", and use a great deal of energy (tens of kW) for heating.

Therefore, an important requirement is to prevent the thermal energy generated from being released into the environment.

For this purpose, for many tens of years it has been common practice to apply a thin layer (less than 100 µm) of gold-based material to the outer surface of the reaction chamber of epitaxial reactors; this gold layer is produced by means of a certain number of painting and drying cycles (it is not easy to obtain a smooth, uniform and non-porous layer) and reflects the infrared radiation emitted by the susceptor well.

In epitaxial reactors where the susceptor is the main element that heats the substrates (for example, in epitaxial reactors with induction heating), appropriate reflection advantageously results in a reduction in the difference in temperature between the front and the back of the substrates during the growth processes.

In general, an important requirement is that the substrates are heated uniformly during the deposition process to obtain high uniformity of thickness and resistivity.

A drawback of the solution with gold layer is that, after a certain time (i.e. a few months), the gold layer becomes detached from the quartz surface of the reaction chamber—the hotter the quartz surface is, the faster the gold layer detaches, also due to the fact that thermal expansion of gold is higher than that of quartz; this phenomenon occurs even more rapidly if the reaction chamber is cooled by means of a gaseous flow (which is relatively common), also due to the mechanical action of the gaseous flow on the layer; moreover, this phenomenon is increased by traces of acids, deriving from previous wash cycles of the reaction chamber, on the surface of the reaction chamber.

Detachment of the gold layer results in an increase in consumption of electrical power of the epitaxial reactor, as part of the infrared radiation emitted by the susceptor is released into the environment.

Moreover, as detachment of the gold layer is not smooth and uniform, this also results in a reduction in the quality of the substrates grown.

Therefore, when detachment occurs, it is necessary to disassemble the reaction chamber from the epitaxial reactor, completely remove the gold layer (already partly detached), re-apply the gold layer and re-assemble the reaction chamber in the epitaxial reactor; these operations take time, are costly and can only be performed a limited number of times.

As already mentioned, the processes of the epitaxial reactors are performed in a cavity of a reaction chamber at high temperatures; therefore, it is necessary to cool the reaction chamber. However, this cooling of chamber can cause excessive and/or non-uniform cooling of the walls that define the space in which the reaction and deposition take place; this results in a reduction in the quality of the substrates grown.

SUMMARY OF THE INVENTION

The general object of the present invention is to overcome the aforesaid drawbacks and satisfy the aforesaid requirements.

This and other objects are achieved through the reaction chamber having the features set out in the appended claims, which form an integral part of the present description.

The idea underlying the present invention is that of providing a quartz component arranged close to the walls of the cavity of the reaction chamber in such a manner as to form a counterwall and to be a wall of the reaction and deposition zone.

Experiments were conducted implementing this idea and results well beyond those expected were achieved: (A) excellent uniformity of thickness and resistivity of the layers deposited, (B) low defectiveness of the layers deposited, (C) reduction in consumption of electricity to heat the reaction and deposition zone, (D) improved utilization of the precursor gases injected into the reaction and deposition zone and therefore greater deposition velocity, (E) a reduction of parasitic depositions on the walls of the cavity of the chamber and therefore fewer stray particles in the reaction and deposition zone and less need to "wash" the chamber, (F) less capture of dopant by the walls of the cavity of the chamber and therefore possibility of producing adjacent deposition layers with more marked or less gradual transition of the level and of the type of doping.

In general, the reaction chamber of an epitaxial reactor, according to the present invention, essentially consists of a quartz piece; said quartz piece comprises a quartz piece portion having at least one internal cavity defined, at least partly, by walls; said cavity comprises a reaction and deposition zone of the epitaxial reactor; said zone is adapted to house at least one susceptor to be heated therein; the reaction chamber also comprises a quartz component arranged close to one or more of said walls in such a manner as to form a counterwall and to be a wall of said zone.

In the reaction chamber according to the present invention, said quartz component can be arranged in such a manner as to form a counterwall for two or three or four of said walls, preferably for three of said walls.

In the reaction chamber according to the present invention, said quartz component can rest on one or two of said walls, preferably on only one of said walls.

In the reaction chamber according to the present invention, said quartz component can essentially consist of a straight or shaped quartz slab, preferably a shaped quartz slab, more preferably a U-shaped quartz slab.

In the reaction chamber according to the present invention, said quartz slab can have a uniform or variable thickness.

In the reaction chamber according to the present invention, at least one interspace is typically defined between said quartz component and said walls. Said interspace can be isolated from said reaction and deposition zone, in particular hermetically isolated.

In the reaction chamber according to the present invention, said interspace can have a uniform or variable width.

In the reaction chamber according to the present invention, two or three or four interspaces, preferably three interspaces, can be defined between said quartz component and said walls, the widths of said interspaces being preferably uniform and equal to one another.

In the reaction chamber according to the present invention, the quartz of said quartz component can be transparent, opaque or reflective.

In the reaction chamber according to the present invention, said quartz component can be coated with a reflective layer on either the interior side or the exterior side, preferably on the side which is closer to said walls.

Said reflective layer is typically adapted to reflect back the infrared radiation emitted by said susceptor in the wavelength interval from 1,000 nm to 10,000 nm, preferably from 1,500 nm to 3,000 nm.

Said reflective layer is preferably made of a quartz-based material.

Said reflective layer can completely or partly coat said quartz component.

Said reflective layer can be completely or partly coated by a layer of vitrified quartz.

In the reaction chamber according to the present invention, said quartz piece portion can have the shape of a cylinder or prism or pyramid cone, preferably substantially of a parallelepiped, and has an axial through hole forming said cavity.

The reaction chamber according to the present invention can comprise flanges at the ends of said quartz piece.

In the reaction chamber according to the present invention, at least one interspace is typically defined between said quartz component and said walls; means can therefore be provided, associated with the chamber, adapted to carry at least one fluid flow, preferably gaseous, within said interspace. Said means can be adapted to carry at least two fluid flows, preferably gaseous, within said interspace, the direction of flow of said flows preferably forming an angle of around 180° between them.

The direction of flow of one or each of said flows can change before and/or during and/or after a growth process.

The velocity and/or flow rate of one or each of said fluid flows can change before and/or during and/or after a growth process.

The fluid of one or each of said flows can comprise hydrogen and/or helium and/or argon.

The composition of one or each of said flows can change before and/or during and/or after a growth process.

One or each of said flows can be adapted to cool said quartz component.

One or each of said flows can be adapted to control or determine thermal exchange between said quartz component and at least one of said walls, in particular the thermal exchange coefficient of said at least one interspace.

One or each of said flows can be such as to maintain substantially the same pressure on two sides of said quartz component before and/or during and/or after a growth process.

According to a further aspect, the present invention also relates to an epitaxial reactor comprising a reaction chamber having one or more of the features set out above.

BRIEF DESCRIPTION OF THE FIGURES

The present invention will be described in detail below, together with the accompanying drawings, wherein:

FIG. 2 shows an example of embodiment of the reaction chamber according to the present invention in three different sectional views (FIG. 2A is a side view, FIG. 2B is a top view, FIG. 2C is a front view)—the chamber of FIG. 2 corresponds to the chamber of FIG. 1 to which technical characteristics according to the present invention have been added.

DETAILED DESCRIPTION OF THE INVENTION

This description and these drawings are provided by way of non-limiting examples; moreover, they are schematic and simplified.

Figure 1A:
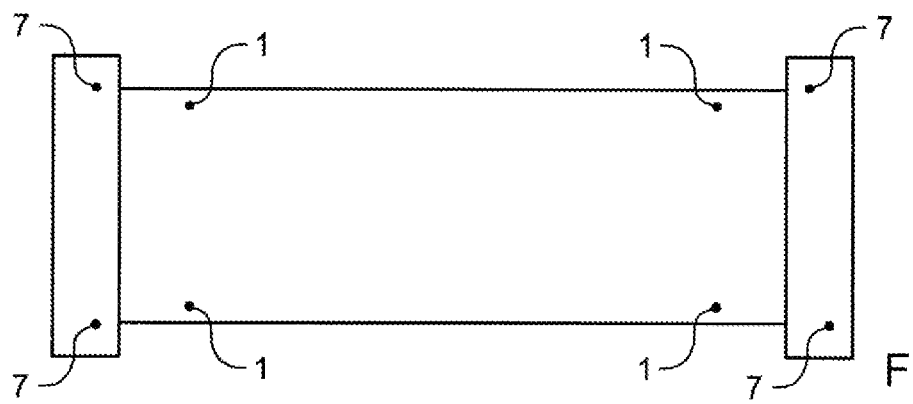
FIG. 1 shows a reaction chamber according to prior art in three different views (FIG. 1A is a side view, FIG. 1B is a top view, FIG. 1C is a front view)
Figure 1B:
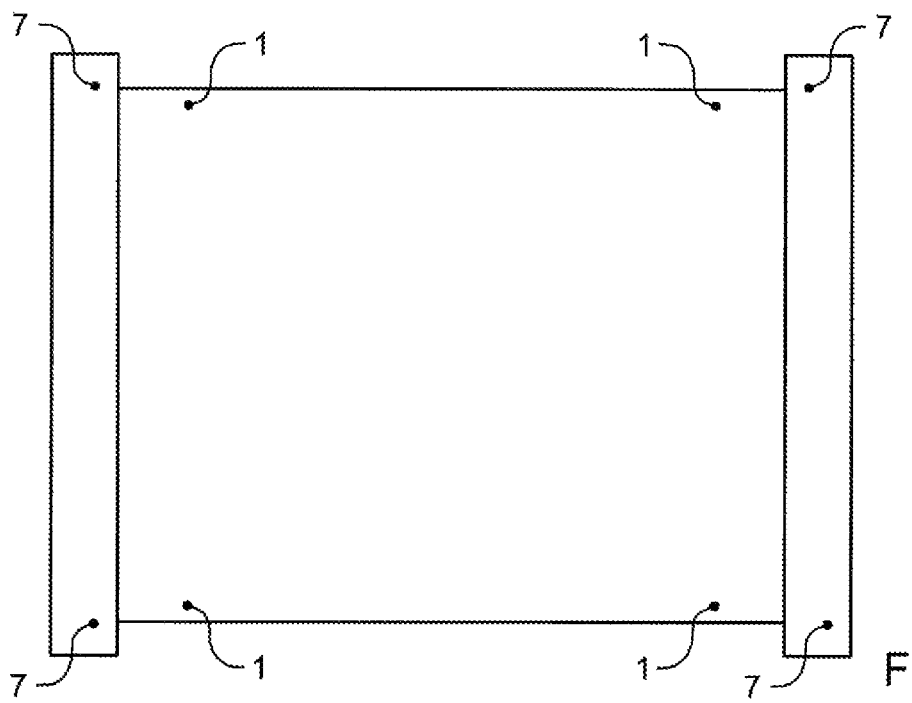
Figure 1C:
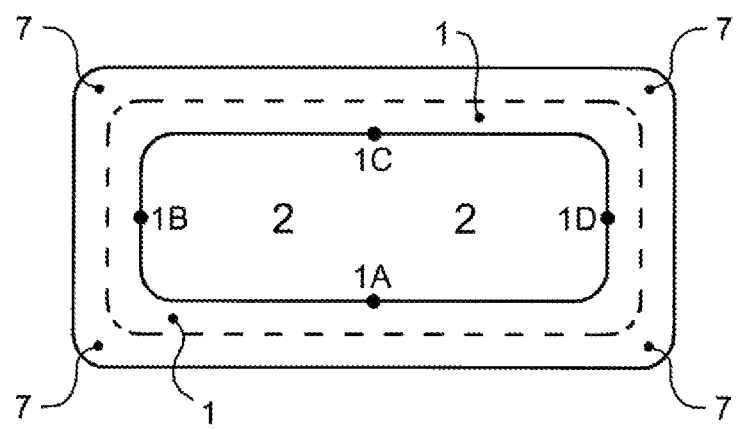

FIG. 1 shows a reaction chamber of an epitaxial reactor essentially consisting of a hollow quartz piece; this hollow quartz piece comprises a quartz piece portion 1 having the shape of a parallelepiped (with rounded longitudinal edges) and an axial through hole 2 produced in the portion 1; the portion 1 is adapted to define according to two of three directions (i.e. width and height—see FIG. 1C) a reaction and deposition zone 3 (not shown in FIG. 1) and to house at least one susceptor (not shown in FIG. 1) to be heated within the hole 2; the hole 2 has a rectangular section (with rounded corners) corresponding in shape to the section of the portion 1 and, in this manner, the portion 1 forms a tube with walls having a substantially constant section; 1A indicates the internal surface of the lower wall, 1B the internal surface of the first lateral wall, 1C the internal surface of the upper wall and 1D the internal surface of the second lateral wall.

The chamber of FIG. 1 is adapted to be arranged horizontally, to house a disk-shaped susceptor, to be associated with induction heating means, and to be used in a "cold wall" reactor (i.e. the temperature of the portion 1 of the hollow quartz piece does not exceed 400-600° C. during epitaxial growth processes and is therefore much lower with respect to that of the susceptor).

The chamber of FIG. 1 also comprises two flanges 7 at the ends of the hollow quartz piece, in particular of the portion 1.

The portion 1 is made of transparent quartz, in particular transparent to visible light, but also to infrared light.

The flanges 7 are made of opaque quartz, in particular opaque (i.e. which blocks the passage and therefore partly reflects and partly absorbs) to visible light, but also to infrared light.

FIG. 2 shows a disk-shaped susceptor 4, mounted on a vertical shaft 8 to support it and make it rotate; the susceptor 4 has slight recesses (in particular five recesses) on the upper face thereof adapted to house substrates on which to perform epitaxial growth; the shaft 8 passes through a circular hole produced in the lower wall of the chamber (retaining means, not shown in this figure, are provided); moreover, this figure shows the reaction and deposition zone 3; finally, it is noted that neither the susceptor 4 nor the shaft 8 is part of the chamber.

The chamber of FIG. 2 differs from that of FIG. 1 essentially due to the fact that it comprises a quartz component 5 arranged close to one or more of the walls of the cavity 2 in such a manner as to form a counterwall and to be a wall of the zone 3; in particular, this is a U-shaped slab, arranged overturned and resting only on the lower wall, specifically on the internal surface 1A of this wall; all this is clearly visible in FIG. 2C; the slab 5 has uniform thickness. This shaped slab can be produced by joining three straight slabs: one adapted to be arranged horizontally and two adapted to be arranged vertically.

The component 2 extends for the complete length of the chamber, in particular to the edge of the flanges 7; alternatively, it could, for example, extend only for the complete length of the portion 1.

In the example of FIG. 2, the component 5 is arranged in such a manner as to produce a counterwall for three walls of the cavity 2, in particular for the two lateral walls and for the upper wall. An interspace 6 is defined between the component 5 and the walls of the cavity 2, which is divided into three portions 6B, 6C, 6D, which are in turn interspaces; the interspace 6B is located between the component 5 and the internal surface 1B of the first lateral wall, the interspace 6C is located between the component 5 and the internal surface 1C of the upper wall, the interspace 6D is located between the component 5 and the internal surface 1D of the second lateral wall; the interspace 6 (and therefore its portions 6B, 6C, 6D) is isolated more or less hermetically from the reaction and deposition zone 3; the widths of the three interspaces 6B, 6C and 6D are substantially (there are slight differences at the edges) uniform and equal to one another, as can be clearly seen in FIG. 2C; these widths are typically in the interval from 1 mm to 10 mm.

The quartz of the component 5 can be transparent, opaque or reflective.

The component 5 can be coated with a reflective layer either on the interior side or on the exterior side thereof; the coating can be total or partial.

According to the most typical embodiment, the component 5 is made of transparent quartz and coated with a reflective layer on the side closer to the walls of the cavity 2, i.e. close to the surfaces 6B, 6C, 6D.

This reflective layer is typically adapted to reflect back the infrared radiation emitted by the susceptor 4 in the wavelength interval from 1,000 nm to 10,000 nm, preferably from 1,500 nm to 3,000 nm.

The reflective layer is preferably made of a quartz-based material; in this manner, the material of the layer is compatible from a chemical point of view (equal or similar chemical properties, i.e. resistance), from a mechanical point of view (equal or similar mechanical properties) and from a thermal point of view (equal or similar thermal properties, i.e. CTE [Coefficient of Thermal Expansion]) with the material of the component.

The thickness of the reflective layer is typically in the interval from 0.5 mm to 1.5 mm and is preferably around 1 mm.

The reflective layer can be obtained according to the following process:
  applying a semi-liquid slurry with a high content (i.e. greater than 80% and lower than 95%) of amorphous quartz particles in dispersion (the dispersion liquid can be water or, for example, alcohol) to the transparent quartz reaction chamber, then
  drying the slurry applied, then
  sintering the dried slurry.

In this manner, a layer can be obtained capable of reflecting on average over 80-90% of the infrared radiation (in the aforesaid wavelength intervals) that strikes the layer.

The reflective layer can be completely or partly coated by a layer of vitrified quartz; this vitrified layer can have a thickness typically in the interval from 0.5 mm to 1.5 mm.

The reflective quartz layer and the superimposed vitrified quartz layer can be obtained with the following single process:
  applying a semi-liquid slurry with a high content (i.e. greater than 80% and lower than 95%) of amorphous quartz particles in dispersion (the dispersion liquid can be water or, for example, alcohol) to the transparent quartz reaction chamber, then
  drying the slurry applied, then
  sintering the dried slurry, then
  vitrifying the surface of the sintered slurry only to a predetermined depth, for example by means of a flame or a laser;
naturally, sufficient slurry must be applied to produce both the reflective quartz layer and the vitrified quartz layer.

The vitrified layer allows the reflective layer below to be protected both from a chemical and from a mechanical point of view; if a vitrified layer of excellent quality is produced, it is also possible to place the reflective layer on the interior of the component (i.e. directly adjacent to the zone 3), which further reduces the thermal energy released into the environment.

Figure 3:
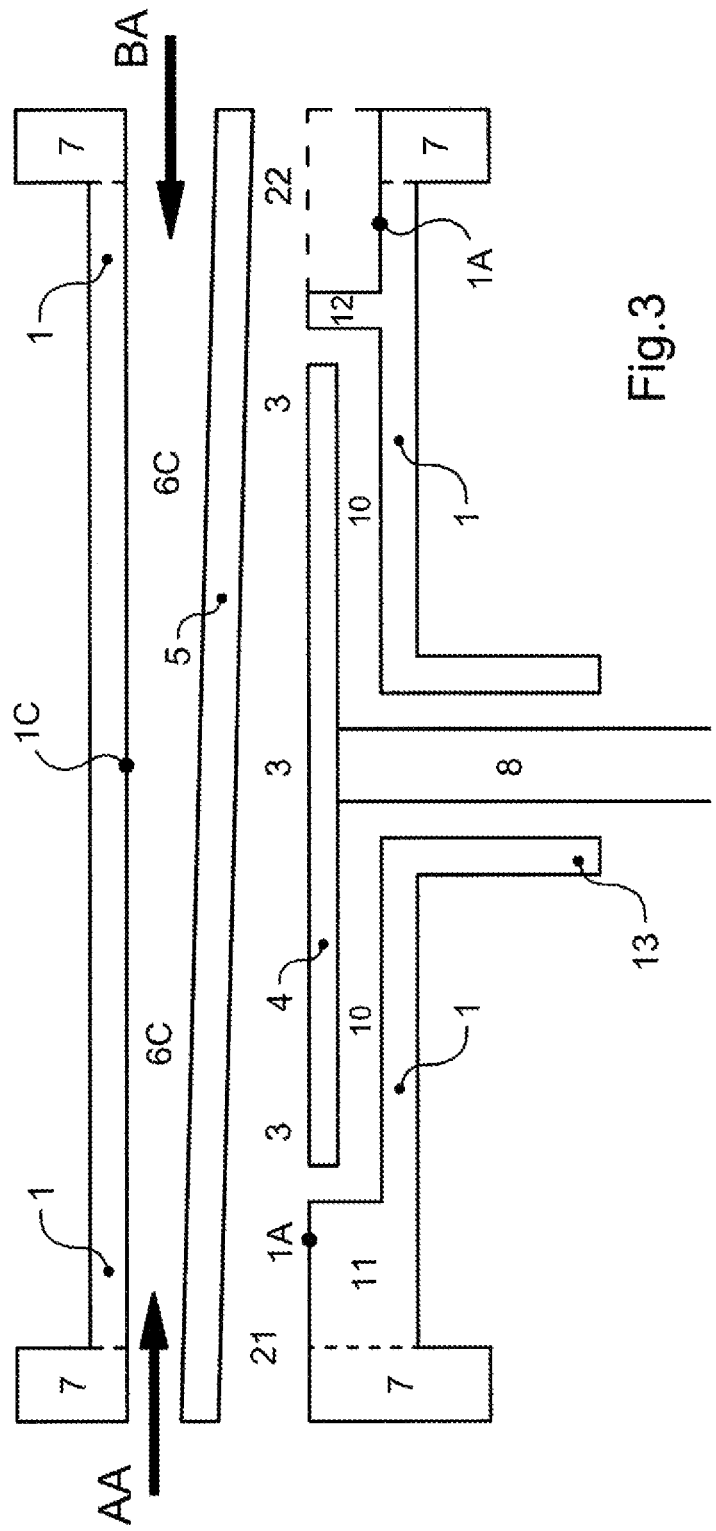
FIG. 3 shows a second example of embodiment of the reaction chamber according to the present invention in a sectional side view—the chamber of FIG. 3 is very similar to the chamber of FIG. 2.

The example of embodiment of FIG. 3 is very similar to that of FIG. 2 (the similarity between FIG. 2A and FIG. 3 are noted); for this reason, corresponding elements are indicated with the same references.

In FIG. 3 it is noted that the susceptor 4 is housed in a recess 10 of the lower wall having the shape of a cylinder and that the shaft 8 is housed in a tube 18 that projects vertically starting from the lower wall of the cavity 2; the hole 2 has an inlet 21 (at the left flange) and an outlet 22 (at the right flange); the precursor gases enter through the inlet 21, pass into the zone 3 where chemical reactions and deposition take place, and the depleted gases exit through the outlet 22; the lower wall has a raised area 11 upstream of the susceptor 4 whose internal surface is aligned with the upper surface of the susceptor 4, and a lowered zone downstream of the susceptor 4; an edge 12 is positioned between the susceptor and the lowered zone; the slab forming the component 5 has constant thickness; the width of the interspace 6C varies gradually, in particular increases gradually from the inlet 21 to the outlet 22 (in this manner the "depletion" effect of the precursor gases can be compensated along the path in the chamber even with a chamber with lower and upper wall perfectly parallel to each other).

As already mentioned, in the reaction chamber according to the present invention, at least one interspace is typically defined between the quartz component and the walls; therefore, means associated with the chamber can be provided, adapted to carry at least one fluid flow, preferably gaseous, within the interspace. This is schematized in FIG. 3, where the component is indicated with 5, the interspace is indicated with 6C and is located between the component 6C and the internal surface 1C of the upper wall, and the arrows AA and BA represent the directions of two possible gas flows.

It is possible to provide only one gas flow according to the direction indicated by the arrow AA, only one gas flow according to the direction indicated by the arrow BA, or both these two gas flows; in this latter case, the flows forming an angle of around 180° between them.

The characteristics of the gas flow or flows can vary greatly; the direction of flow of one or each of said flows can change before and/or during and/or after a growth process; the velocity and/or flow rate of one or each of said flows can change before and/or during and/or after a growth process; the fluid of one or each of said flows can comprise hydrogen and/or helium and/or argon; the composition of one or each of said flows can change before and/or during and/or after a growth process.

The gas flow or flows can be used for various purposes.

One or each of said flows can be adapted to cool the quartz component (indicated in the figures with 5).

One or each of said flows can be adapted to control or determine the thermal exchange between the quartz component (indicated in the figures with 5) and at least one of the walls of the cavity (indicated in the figures with 2), in particular the thermal exchange coefficient of the relative interspace (indicated in the figures with 6).

One or each of said flows can be such as to maintain substantially the same pressure on the two sides of said quartz component (indicated in the figures with 5) before and/or during and/or after a growth process.

From what has been stated, it is understood that, according to the preferred embodiment of the present invention, moving from the reaction and deposition zone (indicated with 3 in the figures) toward the outside of the reaction chamber, first the counterwall (indicated with 5 in the figures), then an interspace (indicated with 6 in the figures) and finally a wall (indicated with 1 in the figures) are encountered; a fluid (preferably gaseous) can flow in the interspace; a fluid (preferably liquid) can flow on the exterior side of the wall. Therefore, there are many parameters (geometric, chemical, thermodynamic and fluid-dynamic) that can be appropriately chosen to control the temperature of the internal surface of the counterwall and the heat that flows from the reaction and deposition zone toward the outside.

The invention claimed is:

1. A cold-wall epitaxial reactor comprising:
    an induction heater and at least one reaction chamber arranged horizontally and housing a susceptor that is disk-shaped, said susceptor being associated with said induction heater;
    said at least one reaction chamber essentially consisting of a quartz piece, wherein said quartz piece comprises a quartz piece portion having an internal cavity defined by walls and an outside, wherein said internal cavity comprises a reaction and deposition zone of the epitaxial reactor, wherein said reaction and deposition zone houses said susceptor to be heated therein, wherein a quartz component is arranged close to said walls in such a manner as to form a counterwall and to be a wall of said reaction and deposition zone, said walls comprising an upper wall and a lower wall,
    wherein in that said quartz component essentially consists of a U-shaped quartz slab arranged upside down between said susceptor and said upper wall of said internal cavity of said at least one reaction chamber, and
    wherein said quartz component rests on said lower wall of the internal cavity of said at least one reaction chamber,
    whereby a temperature of an internal surface of said quartz component is controlled; and
    whereby heat flows from said reaction and deposition zone towards said outside in a controlled manner.

2. The cold-wall epitaxial reactor of claim 1, wherein said quartz component is arranged in such a manner as to form a counterwall for two or three or four of said walls.

3. The cold-wall epitaxial reactor of claim 1, wherein at least one interspace having a uniform or variable width is defined between said quartz component and said walls.

4. The cold-wall epitaxial reactor of claim 3, wherein two or three or four interspaces, are defined between said quartz component and said walls, the widths of said interspaces being preferably uniform and equal to one another.

5. The cold-wall epitaxial reactor of claim 1, wherein said quartz component is coated with a reflective layer on either an interior side or an exterior side.

6. The cold-wall epitaxial reactor of claim 1, wherein at least one interspace is defined between said quartz component and said walls wherein said at least one reaction chamber is associated with a feed adapted to carry at least one fluid flow within said interspace.

7. The cold-wall epitaxial reactor of claim 6, wherein the velocity and/or flow rate and/or direction and/or composition of said at least one fluid flow changes before and/or during and/or after a growth process.

8. The cold-wall epitaxial reactor of claim 1, wherein said quartz component is arranged in such a manner as to form a counterwall for only three of said walls.

9. The cold-wall epitaxial reactor of claim 1, wherein said quartz component rests on only one of said walls.

10. The cold-wall epitaxial reactor of claim 1, wherein said quartz component essentially consists of a straight or shaped profiled quartz slab.

11. The cold-wall epitaxial reactor of claim 3, wherein only three interspaces are defined between said quartz component and said walls, the widths of said three interspaces being preferably uniform and equal to one another.

12. The cold-wall epitaxial reactor of claim 1, wherein said quartz component is coated with a reflective layer on a side which is closer to said walls.

13. The cold-wall epitaxial reactor of claim 1, being arranged so that a gaseous fluid can flow in an interspace between said quartz component and said walls, said walls have exteriors and a liquid fluid can flow on the exteriors of said walls.

14. The cold-wall epitaxial reactor of claim 1, being arranged to deposit monocrystalline silicon on silicon substrates at temperatures between 850° C. and 1,250° C.

15. The cold-wall epitaxial reactor of claim 1, being arranged so that, during epitaxial growth processes, said quartz piece portion does not exceed 400-600° C. and is much colder than said susceptor.

16. The cold-wall epitaxial reactor of claim 1, wherein said quartz component consists of three straight slabs joined together, a first slab is arranged horizontally, a second slab is arranged vertically, and a third slab is arranged vertically.

* * * * *